United States Patent [19]

Siulinski

[11] Patent Number: 5,926,486
[45] Date of Patent: Jul. 20, 1999

[54] AUTOMATED SYSTEM FOR DETERMINING THE DYNAMIC THRESHOLDS OF DIGITAL LOGIC DEVICES

[75] Inventor: James A. Siulinski, Westbrook, Me.

[73] Assignee: Fairchild Semiconductor Corporation, South Portland, Me.

[21] Appl. No.: 08/978,462

[22] Filed: Nov. 25, 1997

[51] Int. Cl.$^6$ .................................................. G01R 31/28
[52] U.S. Cl. .......................................... 371/22.1; 324/765
[58] Field of Search ...................... 371/22.1; 395/183.06, 395/183.01, 183.21, 183.22, 184.01; 324/765, 76.11, 76.12, 158.1

[56] References Cited

U.S. PATENT DOCUMENTS 5,463,639  10/1995  Koishi et al. ........................... 371/27.4
5,530,373  6/1996  Gibson et al. ........................... 324/758

Primary Examiner—Hoa T. Nguyen
Attorney, Agent, or Firm—Pierce Atwood; Chris A. Caseiro

[57] ABSTRACT

An automated dynamic threshold testing system using an oscilloscope and personal computer with an automated testing algorithm for dynamic threshold condition determination within a digital logic device. The system provides a cost-effective alternative to conventional human detection of the threshold condition. The automated testing utilizes digitization of waveform data from the oscilloscope and provides fast storage, retrieval, and analysis of complex and numerous threshold conditions. Reproduction of the testings is easily performed with advantageous applications in debugging and diagnostic procedures.

12 Claims, 4 Drawing Sheets

AUTOMATED SYSTEM FOR DETERMINING THE DYNAMIC THRESHOLDS OF DIGITAL LOGIC DEVICES

BACKGROUND OF THE INVENTION

1. Field of Invention

The present invention relates to the field of testing digital logic devices. More particularly, the present invention relates to a system for determining the dynamic threshold of the digital logic device being tested. More particular yet, the present invention involves determining the dynamic threshold of the digital logic device through an iterative procedure, where the procedure is substantially automated.

2. Description of Prior Art

While digital logic devices are designed with their operational characteristics theoretically determined, there is always the requirement of verifying actual operational characteristics due to known or unknown manufacturing variables such as substrate contamination or inherent impurities that ultimately affect device operation. The ways in which operation suffers include a decrease in a device's tolerance to input extremes and fluctuations. This results in increased failure situations such that the device's dynamic output as shown by its alternating current (AC) characterization will reveal propagation walk, glitches, forced highs and lows, and the like. The point at which these failure situations occur is termed dynamic threshold and can be determined through testing by an electronics technician. Therefore, testing of the given digital logic device is necessary so as to provide product designers with a degree of predictability with respect to the device's characteristics and with respect to the device's compatibility with other elements in the product within which the device is used. In order to obtain an AC characterization of a digital logic device through propagation-delay tests, setup-and-hold tests, functional-speed tests, access-time tests, refresh-and-pause-time tests, and/or rise-and-fall-time tests, it is usually in the particular test specification to run dynamic threshold tests. Ideally, dynamic threshold is reached when the input voltage to the device is either raised or lowered to the point where the output of the device reaches a critical state of instability known as metastability where a failure condition may occur in any of the aforementioned forms.

The conventional manner by which dynamic threshold tests are administered is manually with the aid of an oscilloscope. The oscilloscope is monitored visually by a technician while the input voltage to the device is manually swept across a range of voltage values. When the technician sees the output of the device fail—i.e., exhibit one of the failure conditions—on the oscilloscope, the technician then records the corresponding input voltage at that moment. Because the failure mechanism when the output goes into metastability is complex in nature, requisite human detection during such conventional testing cannot be avoided. Dynamic threshold output failure is a complex condition that may take many different forms as mentioned above. Further, no oscilloscope is capable of detecting such a specialized and varying condition as is the dynamic threshold condition. Thus, human detection, while costly and time-consuming, has been the necessary standard.

In addition to the high cost and burdensome amounts of time required, human detection is subject to the vagaries of interpretation. As already mentioned, dynamic threshold conditions may take many different forms. The difficulty in visually interpreting an oscilloscope in order to determine dynamic threshold may be exacerbated by the technician's degree of familiarity with a given oscilloscope or even exacerbated by simply choosing an inappropriate scale to view a particular test. Further, human detection is limited to a real-time viewing that can result in outputs that are exceedingly difficult to reproduce. Although many oscilloscopes can store an output waveform, metastability must first be detected by the technician before such storage can occur and even then analysis is by visual detection and limited to the single-stored waveform.

Accordingly, the prior art fails to provide any method or device that can provide cost-effective, reproducible, and automated dynamic threshold testing. Therefore, what is needed is a system that provides a dynamic threshold testing procedure without high costs in both technician-time and money. What is also needed is such a system that can easily utilize existing oscilloscopes without requiring labor-intensive human detection of dynamic threshold conditions. Still further, what is needed is such a system that provides both automated and easily-reproducible testing.

SUMMARY OF THE INVENTION

It is an object of the present invention to provide a dynamic threshold testing system that involves substantially reduced costs from conventional dynamic threshold testing. Another object of the present invention is to provide a dynamic threshold testing system that is easily adaptable to standard oscilloscopes and computers. Yet another object of the present invention is to provide a dynamic threshold testing system that operates with minimal human intervention in that it performs substantially automated testing. Still another object of the present invention is to provide a dynamic threshold testing system that can reproduce test results quickly and easily. It is also an object of the present invention to provide such a dynamic threshold testing system that is both stable and dependable.

The dynamic threshold testing system of the present invention includes a means for obtaining an output waveform from a digital logic device. Such means for obtaining the waveform may be any standard type of oscilloscope or similar mechanism that enables the output waveform to be transformable into digitizable data. Such digitizable data is acquired by a computing means such as, but not limited to, a lap-top or desk-top personal computer (PC). A computer program is provided to the computing means in order to acquire and analyze the digitized data. In general, the computer program functions to digitize the digitizable data, to record an ideal set of digitized data from an output waveform of the digital logic device being tested, to incrementally adjust the input voltage to the digital logic device, to digitize the output waveform upon each incremental adjustment, and to compare the digitized data against the recorded ideal set of digitized data in order to determine the point of failure known as the dynamic threshold condition. For purposes of this disclosure, the stored ideal set of data is referred to as the "gold waveform." The method embodied in the computer program will be discussed in more detail in the preferred embodiment section.

Although, this discussion focuses on use of the present invention in evaluation of digital logic devices in the determination of the dynamic threshold condition, any similar testing procedure may benefit by the use of the system disclosed herein. Also, for purposes of illustration, the present invention is discussed in terms of oscilloscopes and PCs; however, it should be understood that the system of the present invention is not intended to be limited to such specific devices.

It is to be understood that other objects and advantages of the present invention will be made apparent by the following description of the drawings according to the present invention. While a preferred embodiment is disclosed, this is not intended to be limiting. Rather, the general principles set forth herein are considered to be merely illustrative of the scope of the present invention and it is to be further understood that numerous changes may be made without straying from the scope of the present invention.

DETAILED DESCRIPTION OF THE PREFERRED EMBODIMENTS

Figure 1:
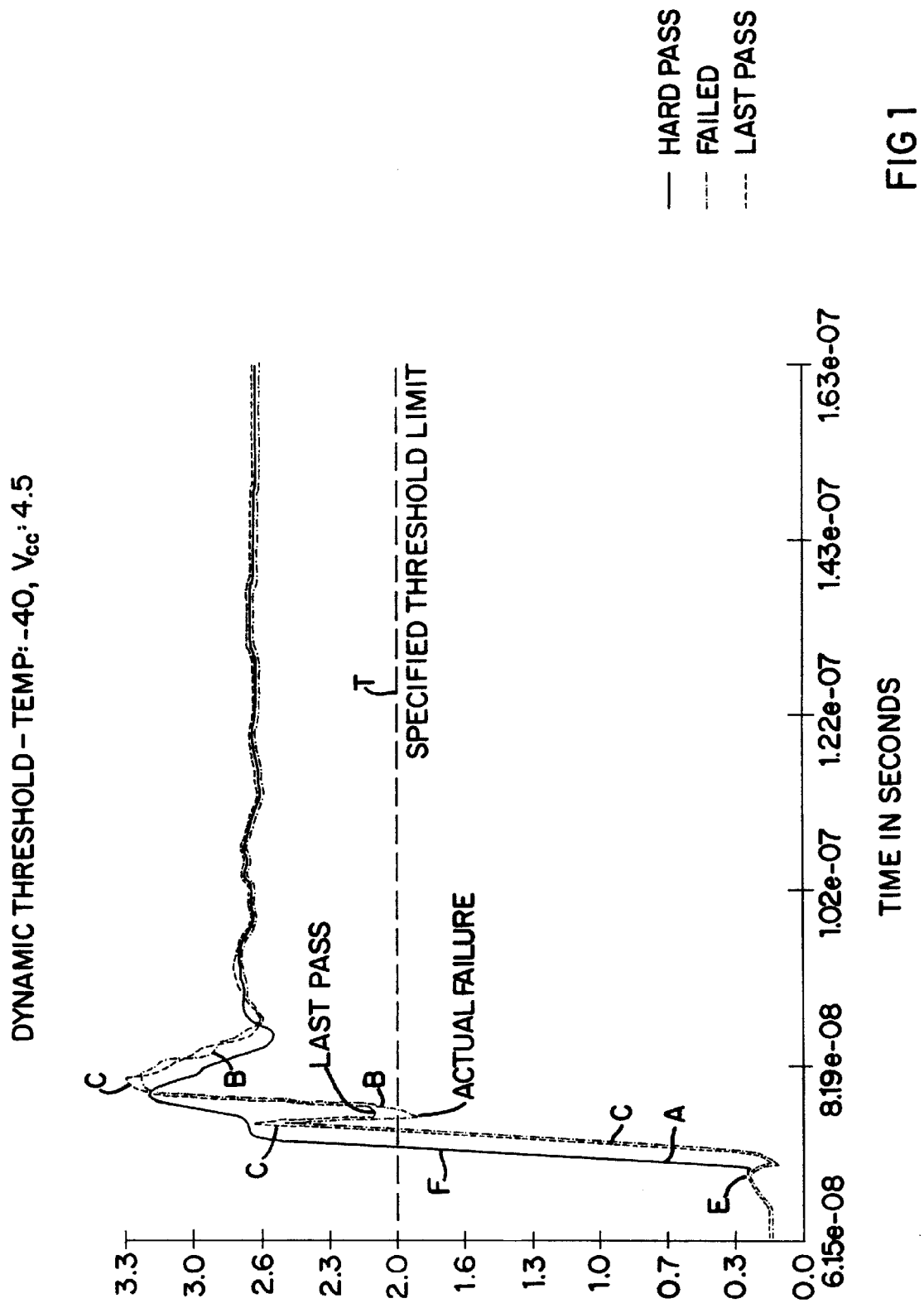
FIG. 1 is a diagram showing waveforms used in accordance with the preferred embodiment of the present invention.

The present invention is an automated dynamic threshold testing system that is designed to minimize the vagaries and time associated with manual testing of circuitry. The present invention includes the obtaining of, analysis of, and comparison to, output waveforms from a circuit or set of circuits under test. As shown in FIG. 1, three waveforms of interest are associated with the present invention. Each waveform is actually the same output from a digital logic device, but taken during different phases of the dynamic threshold testing method. The first waveform A represents the output under test where the input to the device is set to produce a clearly desirable output which is referred to as a hard-pass condition. This hard-pass condition may be triggered, for example, by supplying a very high potential to ensure that the device will definitely be turned on. The first waveform A represents an ideal waveform against which subsequent waveforms are referenced and is referred to as the gold waveform. A second waveform B represents a failed condition of the device. A spike is shown in the second waveform B which spike falls below a specified threshold limit T that is generally a required operating limitation of the device under test. A third waveform C illustrates the output of the device that does not cross the threshold T but that is the last test condition experienced by the device just before the failed condition is realized. That is, the waveform C represents the output of the device just prior to the metastability of the device that occurs in failure.

The last-pass condition of waveform C is datalogged for subsequent retrieval and analysis. By the term datalogged, it is meant that the data that includes the waveform C of the last-pass condition and related input data is recorded in a digital form. It is noted that under conventional oscilloscope use via human detection this last pass condition would be difficult to detect and generally not detectable by normal oscilloscope routines. Through the digitizing algorithm of the present invention, such a last-pass condition spike is easily detected.

Figure 2:
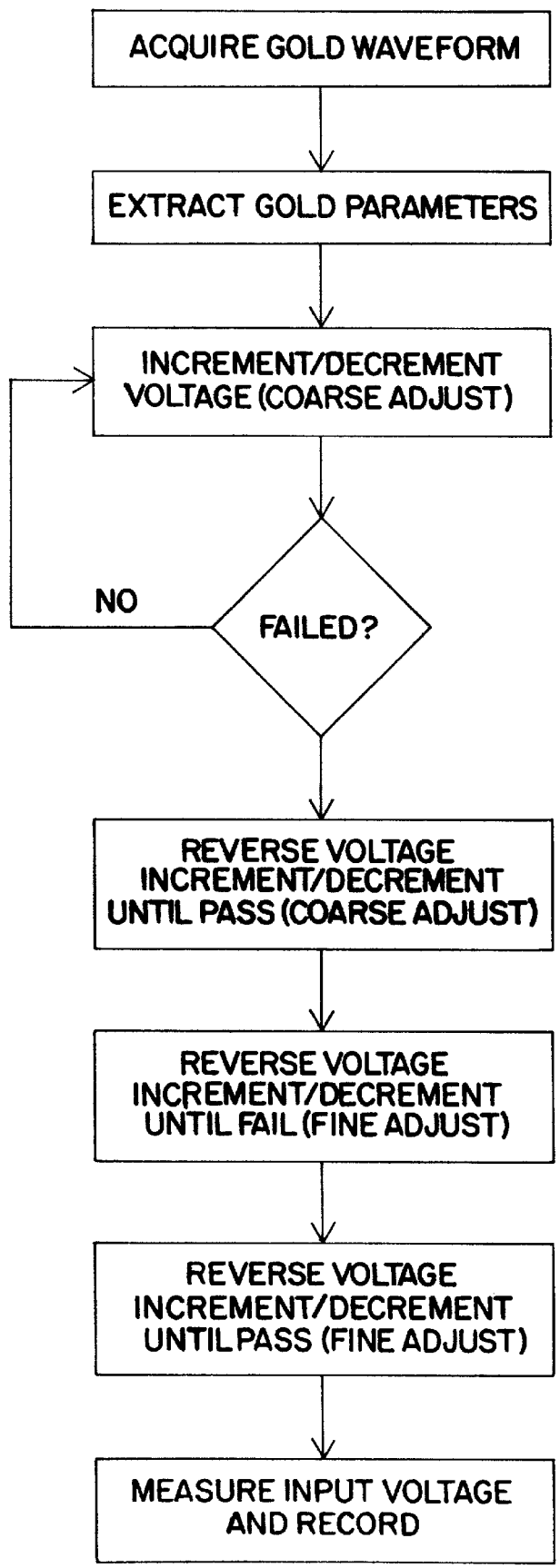
FIG. 2 is a simplified flow chart showing the testing method of the preferred embodiment of the present invention.

FIG. 2 shows a simplified flowchart of the dynamic threshold test as exists within the automated dynamic threshold testing system of the present invention. The system is used in cooperation with an oscilloscope, a digital logic device to be tested, and a computing means—e.g., desktop personal computer—to analyze the testing data. More specifically, the system of the present invention includes an automated method incorporated into software enabling a minimum of eight key test steps.

The first step of the test method is to acquire the gold waveform. This involves placing the digital logic device into a breadboard and supplying the device with some input voltage or somehow otherwise simulating device operation. The output of the device is monitored by an oscilloscope. The output waveform that results when the input forces a hard pass condition is the so-called gold waveform that is used as the ideal waveform. It is against this ideal waveform that all subsequent test outputs of the device under test are compared. The waveform output data is then digitized in a manner well known to those skilled in the art.

The second step is to extract the gold parameters from stored output resulting from the hard-pass input. This involves obtaining the peak output voltage ($V_{goldHI}$), the base output voltage ($V_{goldLO}$), and the 50% point for the gold waveform. For purposes of illustration, $V_{goldHI}$ of the gold waveform A shown in FIG. 1 is at location D, the $V_{goldLO}$ is at location E, and the 50% point is at about location F. Of course, those locations will differ from one device to another. The key is to first define those gold parameters prior to the dynamic threshold testing. It is to be noted that a value ($\Delta V$) as a maximum acceptable deviation from $V_{goldHI}$ or $V_{goldLO}$ may be selected as desired. For purposes of the description of the present invention a deviation, or $\Delta V$, of more than 100 mV will be defined as a failure of the device under test. In addition to extracting the noted gold parameters, the second step includes a determination as to whether the dynamic gold waveform fails prior to test. This determination is made by checking for voltage spikes through the threshold and adjusting the allowable $\Delta V$ to be more than 100 mV different from the spike rather than $V_{goldHI}$.

The third, fourth, and fifth steps of the present invention provide a coarse-adjust loop. This coarse-adjust loop involves a method related to conventional SET/HOLD tests, that is, in the present invention, the third step is a coarse stepping mode that incrementally adjusts the input voltage up or down (depending upon polarity) in relatively coarse changes. These coarse changes may be set as desired; however, it has been observed that for output voltages similar to those presented in FIG. 1, a coarse change of 50 mV per increase (or decrease) is suitable. The fourth step is a failure check to determine whether threshold conditions have been met. This fourth step is a key feature of the invention and will be described in detail with reference to FIGS. 3 and 4. It is to be noted that failure is determined by automated referencing to $V_{goldHI}$, $V_{goldLO}$, the 50% point for the gold waveform, and $\Delta V$. The third step is repeated if no failure is sensed in the fourth step. When failure is detected under the fourth step, a fifth step, in which the coarse voltage changing is reversed, will be enacted and repeated until a pass condition occurs. Once the fifth step results in a pass condition, the sixth and seventh steps are then carried out. It is to be understood that a pass condition occurs when an input to the device under test results in an output waveform that exceeds the threshold T.

The sixth and seventh steps provide a fine-adjust loop for a tighter definition of the operating capabilities of the device under test. The sixth step involves reversing the voltage direction from that associated with the fifth step, such that the voltage change is in the same direction provided under step three. The fine voltage change may be any desired change. For purposes of the example of FIG. 1, the fine voltage change of steps six and seven is preferably about 10 mV. The fine voltage change of step six continues until failure (output below threshold T) occurs. Upon finding failure in the sixth step, the seventh step is carried out, in which the direction of voltage change is again reversed so as to match the direction of change in step five. The fine voltage changes are made until the last passing waveform is obtained. The eighth step is the final step of measuring the output voltage at this fine last passing value and recording such output voltage waveform as well as datalogging the results for future reference.

The fourth step described above is an important part of the present invention and will be referenced as the failure step. This fourth step involves the selection of one of two forms of test evaluation. The first is a static output test (step 4A), and the second is a switching output test (step 4B). The specific failure substep used to analyze the waveform is selectable by the user. After the gold waveform has been digitized and processed, the static output test (step 4A) and the switching output test (step 4B) are differentiated as follows.

Figure 3:
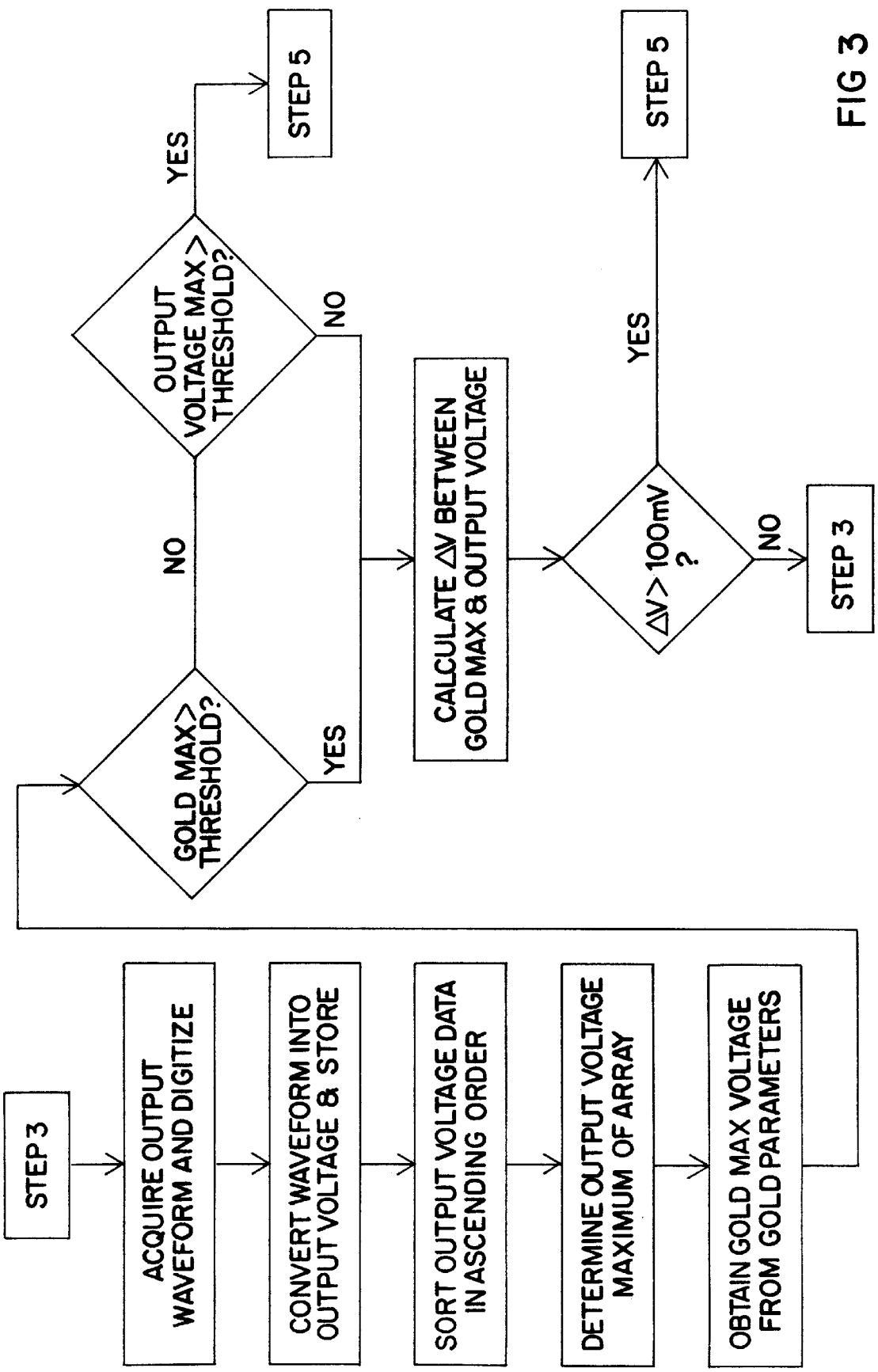
FIG. 3 is a simplified flow chart showing details of the failure analysis portion of the testing method of the present invention under static conditions.

Static Output Test: As illustrated in FIG. 3, step 4A includes the following substeps. In substep #A1, the output waveform is digitized after each input voltage adjustment up or down as a function of the parameters of the device under test. In substep #A2, the digitized waveform is converted into its voltage time components and stored in an array for processing. In substep #A3, the voltage data of the array is sorted in ascending order. In substep #A4, the maximum output voltage value is then determined by considering the fifth-highest voltage value of the array. An alternative peak output voltage value of the array could be selected as the maximum in this step. However, it has been observed that any anomaly, such as a noise spike, that may be acquired during the test is likely to be resolved in less than five data points, depending on the frequency of sampling and the pulse width of the anomaly. In substep #A5, the maximum voltage value is obtained from the gold array. In substep #A6, a comparison is made between the gold maximum voltage and the threshold value that defines the acceptability of the device under test. This comparison is used to determine whether the device's output violates that threshold before any additional testing is required to fix with greater certainty the device's dynamic characteristics.

Within substep #A6, if the gold max voltage is less than the defined threshold value, the output maximum voltage from the array is compared to the threshold. If that output maximum voltage is greater than threshold, then device failure is acknowledged and the test moves to the fifth step. If the gold max voltage is greater than the threshold, then the difference between gold max and output max is calculated. If the difference between those two test values is greater than 100 mV, then the device is deemed failed and the test moves to the fifth step. While 100 mV is chosen in the instant case, it should be noted that any value that represents a preferred tolerance may be chosen that differs from 100 mV. An additional check is done to see if other sections of the waveform go through the threshold value but don't reach the amplitude of any initial bounce through threshold, i.e., when the gold waveform bounces through threshold at the initiation of testing. This is accomplished by noting how many samples actually go through threshold on the gold waveform and comparing that to the number of samples going through threshold of the output waveform during the test. If the number of samples from the current waveform is greater than that of the gold waveform (plus 5 samples for error) a failure is returned and the test moves to the fifth step; that is, the step of coarse voltage changing is reversed, will be enacted and repeated until a pass condition occurs.

Figure 4:
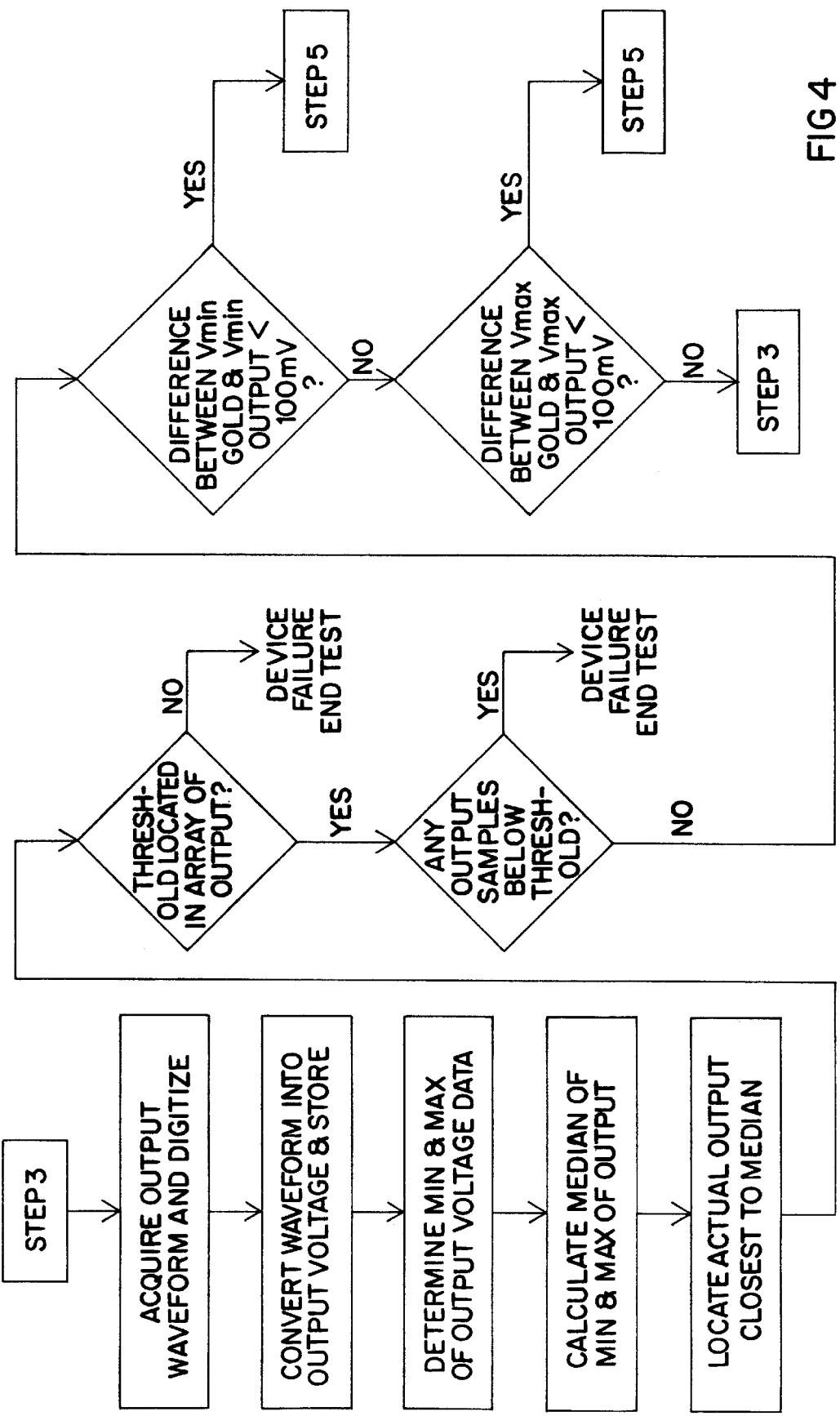
FIG. 4 is a simplified flow chart showing details of the failure analysis portion of the testing method of the present invention under switching conditions.

Switching Output Test: As illustrated in FIG. 4, step 4B includes the following substeps for testing the device under test as it is switching between logic high and logic low. In substep #B1, the output waveform is digitized after each input voltage adjustment up or down as a function of the parameters of the device under test. In substep #B2, the digitized waveform is converted into its voltage time components and stored in an array for processing. In substep #B3, minimum and maximum output voltage values are derived from extremes of the array (first and last locations, with the value at the fifth location an option in order to avoid anomalies). In substep #B4, the 50% point, or mid-point between those minimum and maximum values point, is calculated. In substep #B5, the output value from the array that is closest to that calculated crossing value is selected. In substep #B6, the location of the threshold value within the array is found. It should be noted that if the location of the threshold is not found in the array, then the waveform has likely collapsed or floated and a failure is returned such that test moves to the fifth step. In substep #B7, the number of samples falling below the threshold after initial detection of the threshold in the array are located. If any are detected, a failure is returned and the test moves to the fifth step. If there are no samples of the output array that fall below the threshold, in substep #B8, a check for gross minimum voltage ($V_{lo}$) failure is done by comparing the difference between $V_{goldLO}$ and the minimum output voltage of the waveform under test, $V_{min}$, against the allowed voltage change parameter $\Delta V$ calculated from the gold parameters. For example purposes, this is 100 mV. If the difference is greater than 100 mV, a failure is returned and the test moves to the fifth step. If the difference is less than 100 mV, then the same analysis is done for gross maximum voltage ($V_{hi}$) failure. In substep #B9, a check for gross $V_{hi}$ failure is done by comparing the difference between $V_{goldHI}$ and the maximum output voltage of the waveform under test, $V_{max}$, against the allowed voltage change parameter $\Delta V$. If the difference is greater than 100 mV, a failure is returned and the test moves to the fifth step; that is, the step of coarse voltage changing is reversed, will be enacted and repeated until a pass condition occurs. If the difference is less than 100 mV, then the test returns to the third step.

An optional substep may be performed at this point to check for propagation walk condition. Such propagation walk condition can be determined by comparing the median voltage between $V_{goldLO}$ and $V_{goldHI}$ (to obtain the gold cross (50% point)) and the closest selected crossing value of the median output from substep #B5. The maximum acceptable deviation between the two crossing values may be set as desired. Violation of that acceptable deviation is an indicator of undesirable propagation walk that may or may not be defined as a device failure.

As mentioned above, the result of these steps provides automated detection of the dynamic threshold condition. More particularly, the final step provides measuring of the input voltage at the last passing value. This occurs immediately prior to metastability at a point that is not detected during normal oscilloscope routines. The final step also provides for recording the input voltage at the last passing value. This useful information is thus obtained cost-effectively and efficiently.

It should be understood that the preferred embodiments mentioned here are merely illustrative of the present invention. Numerous variations in design and use of the present invention may be contemplated in view of the following claims without straying from the intended scope and field of the invention herein disclosed.

I claim:

1. An automated dynamic threshold testing system for automated determination of a threshold condition within a digital logic device, said system comprising:
   a) signal input means coupled to the digital logic device for supplying an input signal waveform to the digital logic device for simulating operation of the digital logic device such that the digital logic device produces an output signal waveform;
   b) a waveform-acquiring mechanism coupled to the digital logic device for obtaining from said output of the digital logic device said output signal waveform including a reference waveform;
   c) computing means coupled to said signal input means and to said waveform-acquiring mechanism, said computing means for transforming said waveforms into digitizable data, for extracting reference parameters from said reference waveform, and for adjusting said input signal supplied by said signal input means to the digital logic device to determine a failure condition of the digital logic device; and
   d) a recording means for identifying and storing a failure-triggering input signal waveform and a failure-indicating output signal waveform identified and stored at an instance when said failure condition occurs.

2. A method for automating a dynamic-threshold-testing-procedure for a digital logic device, said method utilizing a computing means for automated determination of a threshold condition within said digital logic device, an acquisition means for obtaining a reference waveform, an extraction means for determining reference parameters from said reference waveform, a failure determining means for detection of a failure condition, and a recording means for identifying and storing an input waveform and an output waveform identified and stored at an instance when said failure condition occurs, said method comprising the steps of:
   a) transmitting to the digital logic device the input waveform so as to generate from the digital logic device the output waveform including the reference waveform, and acquiring the output waveforms with the acquisition means;
   b) digitizing the output waveform and the reference waveform and processing in digitized form the reference waveform and the output waveform received by the computing means from the acquisition means, wherein the computing means includes the extraction means, the failure determining means, and the recording means; and
   c) reviewing in digitized form the reference waveform and the output waveform via said computing means so as to define an input signal of the input waveform that causes output by the digital logic device of an unacceptable output waveform.

3. A method for automating a dynamic threshold testing procedure for a digital logic device, said method comprising the steps of:
   a) supplying said digital logic device with an input voltage;
   b) monitoring an output of said digital logic device with an oscilloscope;
   c) adjusting said input voltage to force a hard pass condition in said digital logic device that results in a reference output from said digital logic device;
   d) extracting with computing means a peak voltage and a base voltage from said reference output received by said computing means from said oscilloscope;
   e) incrementally adjusting said input voltage in coarse increments;
   f) checking with said oscilloscope and said computing means for a threshold condition;
   g) reversing said incrementally adjusting step by said coarse increments upon observing with said computing means occurrence of said threshold condition such that said input voltage is oppositely adjusted in coarse increments;
   h) checking for a pass condition;
   i) reversing said incrementally adjusting step by said coarse increments upon observing with said computing means occurrence of said threshold condition checking such that said input voltage is oppositely adjusted in fine increments;
   j) re-checking for said threshold condition;
   k) reversing said incrementally adjusting step by said fine increments upon observing with said computing means occurrence of said threshold condition checking such that said input voltage is oppositely adjusted in fine increments;
   l) re-checking for said pass condition; and
   m) recording, upon occurrence of said pass condition, an input waveform and an output waveform.

4. The method as claimed in claim 3 wherein the steps that involve checking or re-checking said threshold condition each further include the steps of:
   a) digitizing said output waveform after each input voltage adjustment;
   b) converting said digitized waveform into a voltage array;
   c) sorting said voltage array in ascending order;
   d) determining a maximum voltage value from a last array location; and
   e) comparing said maximum voltage value to said peak voltage.

5. The method as claimed in claim 4 wherein upon said peak voltage being greater than said maximum voltage, the step of comparing said maximum voltage value to said peak voltage further includes the steps of:
   a) calculating a delta is calculated between said maximum voltage and said peak voltage; and
   b) returning a failure condition if said delta exceeds a value of 100 mV.

6. The method as claimed in claim 5 further including the steps of:
   a) calculating a first number of voltages from said voltage array which cross through said peak voltage,
   b) comparing said first number to a second number of voltages of an instantaneous waveform which cross through said peak voltage, and
   c) returning a failure condition if said second number plus five is greater than said first number.

7. The method as claimed in claim 4 wherein upon said peak voltage being less than said maximum voltage, the step of comparing said maximum voltage value to said peak voltage further includes the steps of:
   a) comparing said peak voltage to said maximum voltage and
   b) returning a failure condition if said maximum voltage is greater than said peak voltage.

8. The method as claimed in claim 3 wherein the steps that involve checking or rechecking said threshold condition each further include the steps of:
   a) digitizing said output waveform after each input voltage adjustment;
   b) converting said digitized waveform into a voltage array;
   c) sorting said voltage array in ascending order;
   d) determining a minimum voltage from a first array location and a maximum voltage value from a last array location;
   e) calculating a cross-value by adding said minimum value and said maximum value and dividing by two;
   f) finding a 50% point by locating a value in said voltage array that is closest to said cross-value;
   g) determining if said peak voltage is within said voltage array; and
   h) returning a failure condition if said peak voltage is not within said voltage array.

9. The method as claimed in claim 8 wherein, when said peak voltage is within said voltage array, the method further includes the step of returning a failure condition when a delta of said base voltage and said minimum voltage is greater than 100 mV.

10. The method as claimed in claim 9 wherein the method further includes the step of returning a failure condition when a delta of said peak voltage and said maximum voltage is greater than 100 mV.

11. The method as claimed in claim 10 wherein the method further includes the step of returning a failure condition when said 50% point exceeds said cross-value.

12. The method as claimed in claim 11 wherein the method further includes the step of returning a failure condition when more than one values of said voltage array exceeds said peak voltage.

* * * * *